(12) United States Patent
Kirn

(10) Patent No.: US 7,839,616 B2
(45) Date of Patent: *Nov. 23, 2010

(54) LOAD CURRENT SENSING TECHNIQUE

(76) Inventor: Larry Kirn, 2106 Kenwood Ave., Austin, TX (US) 78704

( * ) Notice: Subject to any disclaimer, the term of this patent is extended or adjusted under 35 U.S.C. 154(b) by 0 days.

This patent is subject to a terminal disclaimer.

(21) Appl. No.: 12/353,149

(22) Filed: Jan. 13, 2009

(65) Prior Publication Data

US 2009/0121703 A1    May 14, 2009

Related U.S. Application Data

(63) Continuation of application No. 10/916,128, filed on Aug. 11, 2004, now Pat. No. 7,489,489.

(60) Provisional application No. 60/494,247, filed on Aug. 11, 2003.

(51) Int. Cl.
*H02H 3/00* (2006.01)
*H02H 1/00* (2006.01)

(52) U.S. Cl. ...................................... 361/93.1

(58) Field of Classification Search ................. 361/93.1
See application file for complete search history.

(56) References Cited

U.S. PATENT DOCUMENTS

| | | | |
|---|---|---|---|
| 3,982,174 A | 9/1976 | Maddox | 323/17 |
| 4,809,122 A | 2/1989 | Fitzner | 361/18 |
| 5,212,616 A * | 5/1993 | Dhong et al. | 361/18 |
| 5,724,218 A * | 3/1998 | Tihanyi | 361/79 |
| 6,377,118 B1 | 4/2002 | Shigaki et al. | 330/149 |
| 6,680,837 B1 | 1/2004 | Buxton | 361/93.9 |
| 7,489,489 B2 * | 2/2009 | Kim | 361/93.1 |
| 7,548,097 B2 * | 6/2009 | Dake et al. | 327/110 |
| 2005/0094342 A1 | 5/2005 | Kirn | 361/100 |
| 2008/0129266 A1 | 6/2008 | Endo et al. | 323/284 |

* cited by examiner

*Primary Examiner*—Ronald W Leja
(74) *Attorney, Agent, or Firm*—Dorsey & Whitney LLP

(57) ABSTRACT

Methods and apparatus regulate the output of a switching device to a voltage near that of saturation. In the preferred embodiment, this is accomplished for a small period of time during activation before and/or after device saturation. The switching device drive requirement is then measured to attain the regulated voltage. Measurement of the drive requirement during the small period of time correlates to switching driver current, being reliant on the finite gain of the switching device.

22 Claims, 1 Drawing Sheet

LOAD CURRENT SENSING TECHNIQUE

REFERENCE TO RELATED APPLICATION

This application is a continuation of U.S. patent application Ser. No. 10/916,128 filed Aug. 11, 2004, which claims priority from U.S. Provisional Patent Application Ser. No. 60/494,247, filed Aug. 11, 2003. The entire content of both applications are each incorporated by reference herein.

FIELD OF THE INVENTION

This invention relates generally to switching power drivers and, in particular, to a technique excessive current and fault conditions are detected efficiently and without significant cost.

BACKGROUND OF THE INVENTION

Switching power drivers offer far greater efficiency than their analog counterparts, due to saturated operation at all times. Particularly because of saturated operation, however, instances of excessive current flow must be externally detected in order to avoid damage.

Hall-effect devices used for this purpose increase system cost considerably. Series load-sensing resistors impact not only cost, but efficiency itself, the prime reason for use of switching drivers.

A need therefore exists for a technique whereby switching driver current and fault conditions are detected efficiently and without significant cost.

SUMMARY OF THE INVENTION

The present invention is directed to methods and apparatus for regulating the output of a switching device to a voltage near that of saturation. In the preferred embodiment, this is accomplished for a small period of time during activation before and/or after device saturation. The switching device drive requirement is then measured to attain the regulated voltage. Measurement of the drive requirement during the small period of time correlates to switching driver current, being reliant on the finite gain of the switching device.

DETAILED DESCRIPTION OF THE INVENTION

Figure 1:
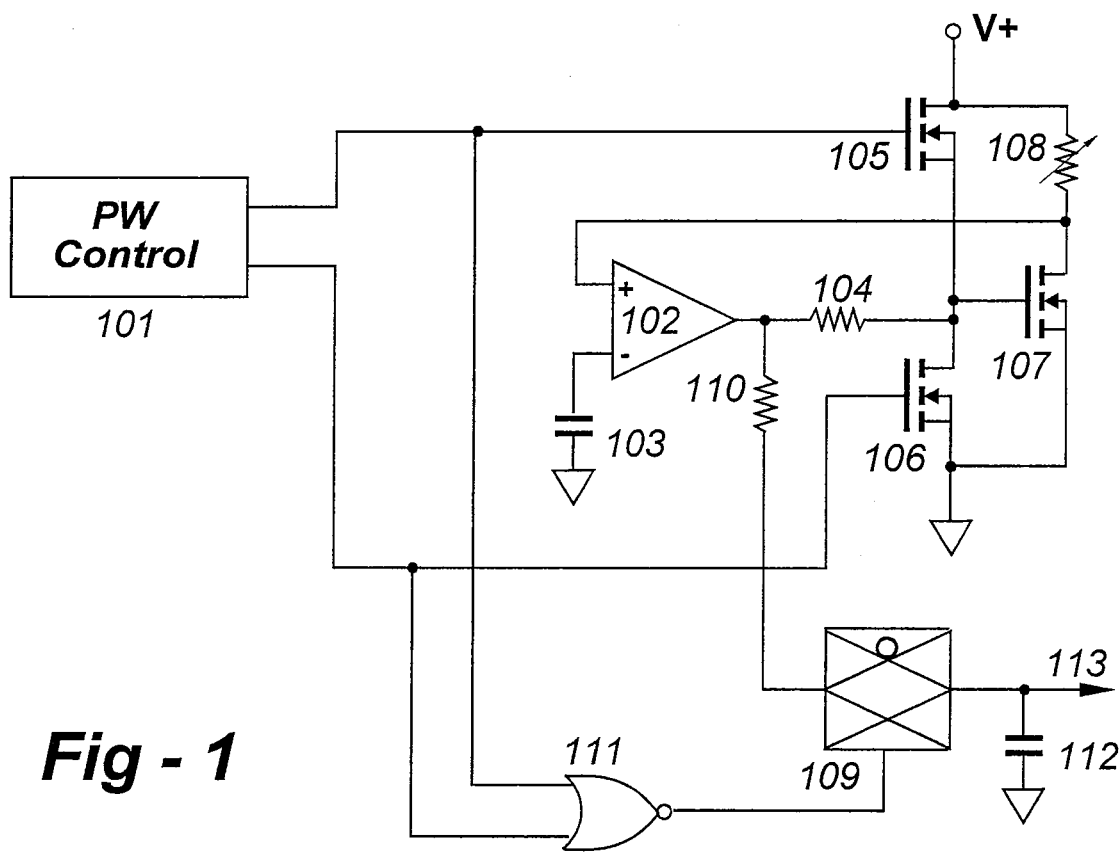
FIG. 1 shows a preferred embodiment of the present invention in a low-side driver configuration.

Referring now to FIG. 1, pulsewidth controller 101 issues positive-going pulses to assert one of either switching device 105 or 106, in a manner known in the art. Switching device 105, when so asserted, sources current to the control input of switching device 107, activating it. Switching device 106, when so asserted, sinks current to the control input of switching device 107, deactivating it. Switching device 107, when activated, sinks current through load resistance 108.

When neither switching device 105 nor 106 are activated by pulsewidth controller 101, amplifier 102 outputs a voltage through resistor 104 to switching device 107, so as to cause the output voltage of switching device 107 to approach that of reference voltage 103. Resistor 104 prevents destruction of amplifier 102 by either switching device 105 or 106. Reference voltage is assumed to be extremely small. When neither switching device 105 nor 106 are activated, switching device 107 then can be seen to sink a current approaching its saturated maximum. Switching device 107 dissipation during this condition does not appreciably increase over that in saturation.

When neither switching device 105 nor 106 are activated, NOR gate 111 activates transmission gate 109, which charges capacitor 112 to the voltage output by amplifier 102, through resistor 110. When either switching device 105 or 106 are subsequently activated, NOR gate 111 disables transmission gate 109, preserving the previous capacitor 112 voltage. The voltage 113 resultant of the circuitry described above remains representative of the drive requirement of switching device 107, when approaching current saturation. Voltage 113 is then related to switching device 107 current by switching device 107 transconductance at its present output current, so is an approximation of switching device 107 output current. Window comparisons of current approximation voltage 113 can now be made to ascertain load faults, as commonly done in the art.

Figure 2:
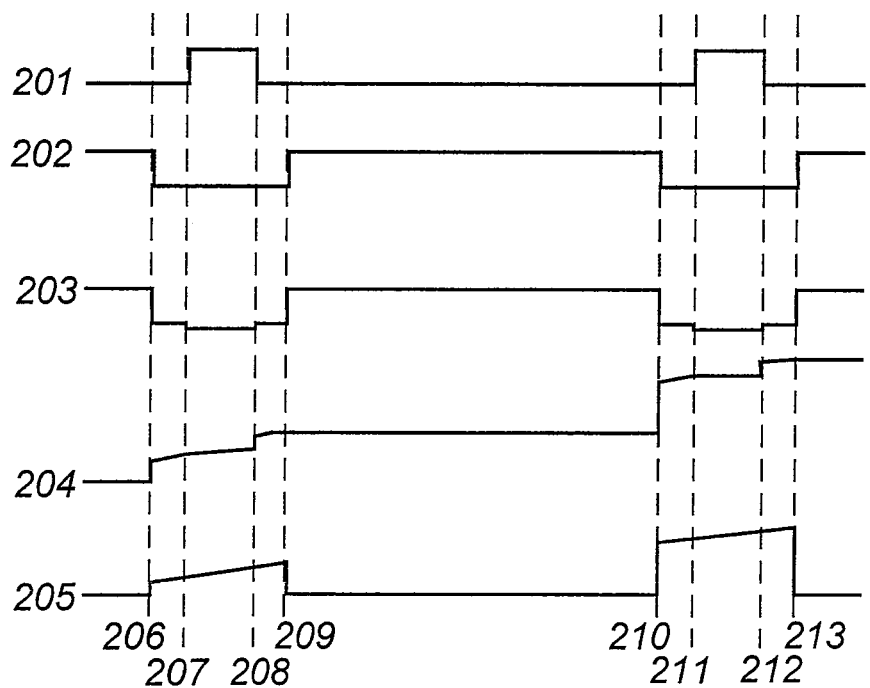
FIG. 2 shows voltage and current waveforms for the circuit of FIG. 1 during normal operation with increasing driver current.

Referring now to FIG. 2, trace 201 and 202 show control inputs of switching devices 105 and 106, respectively, of FIG. 1. Trace 203 shows resultant voltage at the output of switching device 107 presented to load 108, of FIG. 1. Trace 204 shows current approximation voltage 113 and trace 205 shows current through load 108, both of FIG. 1. Note that the resistance of load 108 is gradually decreased throughout FIG. 2, resulting in increasing current when switching device 107 is activated.

At time marker 206, switching device 106 deactivation is seen in trace 202, resulting in decreased voltage from switching device 107 (seen in trace 203) and increasing current approximation voltage 113 (seen in trace 204) as switching device 107 begins to sink current. Voltage 113 in trace 204 slowly increases with load current seen in trace 205, until switching device 105 is asserted, as seen in trace 201 at time marker 207. In that transmission gate 109 is now deactivated by NOR gate 111, voltage 113 seen in trace 204 remains static until time marker 208. At time marker 208, switching device 105 deactivation is seen in trace 201, which, through the action of transmission gate 109, causes current approximation voltage 113 seen in trace 204 to rise, indicating the increased switching device 107 current indicated in trace 205. At time marker 209, the transmission gate 109 is again deactivated by NOR gate 111, allowing capacitor 112 to retain the previous current approximation voltage, as seen in trace 204. A similar set of control pulses is seen in traces 201 and 202 at time markers 210, 211, 212, and 213, resulting in similar current approximation voltage 113 changes seen in trace 204. Note that the increase in current, as seen in trace 205, results in increased current approximation voltage 113 seen in trace 204.

Although saturation of switching device 107 of FIG. 1 is desirable for maximum efficiency, it is anticipated that the technique described herein will find use without the switching device 107 saturated state enforced by switching device 105.

Although shown using a single switching device, the present invention will find use with complementary drivers, or multiple-voltage drivers, such as multi-reference switching amplifiers. An additional benefit to the present invention in these configurations is the possible avoidance of V+>Ground or Ground>V+ transitions. Imposition of an intermediate voltage state between these two extremes can be used to mitigate shoot-through currents which commonly plague H-bridge output stages. It is anticipated that the current measurement afforded by the present invention will be used to adaptively adjust specific output switching device timing so as to entirely avoid either shoot-through current or dead time between sinking and sourcing drivers. When driving inductive loads, snubber circuits would thus become unnecessary.

Whereas transconductance or current gain of practical switching devices is rarely linear through broad current ranges, linearization of the current approximation voltage generated herein is anticipated.

Although voltage-driven MOSFET switching devices are shown herein, it is observed that the current invention functions equally well with current-driven switching devices, and affords either voltage or current representation of output switching device current.

The circuitry shown herein is shown in simplified form to better illustrate the specific technique employed. Use of additional sample/hold circuitry, differential error amplification, and orchestrated timing delays are anticipated for their potential improvements on circuit operation. Although use of static comparison references is shown herein, the use of dynamic references, which detect changes in load current, are anticipated.

I claim:

1. A method of measuring an output current from a power driver, the method comprising:
    alternately activating and deactivating an output switching device of the power driver to provide the output current; and
    generating a voltage signal at a gate terminal of the output switching device during a portion of a time period when the output switching device is activated, wherein the voltage signal represents the output current and is measured.

2. The method of claim 1, wherein the output current represents current through a load, and wherein the voltage signal is generated without placing a resistor in series with the load.

3. The method of claim 1, wherein the portion of the time period when the output switching device is activated comprises a period of time when the output switching device is not in saturation.

4. The method of claim 1, further comprising accumulating electric charge in an energy storage device based on the voltage signal.

5. The method of claim 1, wherein the voltage signal is related to the output current, at least in part, by a characteristic of the output switching device.

6. The method of claim 5, wherein the characteristic comprises transconductance of the output switching device.

7. A method of monitoring an output current from a power driver for load fault conditions, the method comprising:
    generating a voltage at a gate terminal of an output switching device for the power driver, wherein the voltage represents the output current; and
    coupling the gate terminal to an energy storage device during a portion of an activation period for the output switching device, wherein the output switching device allows the output current to flow through an output load during the activation period, and wherein the electric charge stored in the energy storage device corresponds to the output current.

8. The method of claim 7, wherein the portion of the activation period for the output switching device comprises at least one of a period of time before the output switching device enters a saturation mode or a period of time after the output switching device exits the saturation mode.

9. The method of claim 7, further comprising approximating a value of the output current based, at least in part, on the electric charge and a characteristic of the output switching device.

10. The method of claim 9, wherein the characteristic comprises transconductance of the output switching device.

11. A method of monitoring an output current from a power driver for load fault conditions, the method comprising:
    activating and deactivating an output switching device for the power driver, wherein the output switching device allows flow of the output current through a load when the output switching device is activated; and
    generating a voltage at a gate of the output switching device when first and second control devices are both deactivated, wherein the voltage at the gate corresponds to the output current.

12. The method of claim 11, wherein the output switching device is deactivated when the first control device is activated and activated when the first control device is deactivated, wherein the output switching device operates in saturation mode when the second control device is activated, and wherein the output switching device is activated and operates near saturation when the first and second control devices are both deactivated.

13. The method of claim 11, wherein said generating a voltage comprises accumulating electric charge in an energy storage device.

14. The method of claim 11, further comprising deriving an approximate value of the output current based, at least in part, on the voltage level of the generated voltage and a characteristic of the output switching device.

15. The method of claim 14, wherein the characteristic comprises transconductance of the output switching device.

16. A power driver, comprising:
    an output stage, including an output switching device, configured to provide an output current and having first and second switching devices coupled to the output switching device, wherein the first and second switching devices are alternately activated and deactivated; and
    a monitoring circuit configured to generate a signal at a gate of the output switching device when neither the first nor the second switching device is activated, wherein the signal represents a value of the output current.

17. The power driver of claim 16, wherein the output current is approximated based, at least in part, on the generated signal and a characteristic of the output switching device.

18. The power driver of claim 17, wherein the characteristic comprises transconductance of the output switching device.

19. The power driver of claim 16, wherein the generated signal comprises a voltage.

20. A power driver configured to couple to a load resistance and measure current through the load resistance, the power driver comprising:
    an output switching device including a control terminal, an output terminal, and a third terminal, wherein the output terminal is configured to couple to the load resistance, and wherein the output switching device is configured to sink current through the load resistance in response to an activation signal being present at the control terminal of the output switching device;
    a first switching device coupled to the control terminal of the output switching device and configured to activate the output switching device in response to activation of the first switching device;
    a second switching device coupled to the control terminal of the output switching device and configured to deactivate the output switching device in response to activation of the second switching device; and an amplifier having a first terminal coupled to the output terminal of the output switching device and a second terminal configured to couple to a reference voltage, wherein the amplifier is configured to apply the reference voltage to the control terminal of the output switching device when both the first and second switching devices are deactivated, thereby establishing a voltage at the control terminal of the output switching device proportional to a current through the load resistance.

21. The power driver of claim 20, wherein:

the first and second switching devices each comprise a control terminal and a respective output terminal;

the respective output terminals are both coupled to the control terminal of the output switching device; and the power driver further comprises a pulse-width modulator coupled to the control terminals of the first and second switching devices, wherein the pulse-width modulator is configured to generate control signals for the first and second switching devices in accordance with an audio input signal.

22. The power driver of claim 21, wherein the pulse-width modulator is further configured to send deactivation signals to both the first and second switching devices for a period of time so that the voltage proportional to the current through the load resistance is developed at the control terminal of the output switching device.

* * * * *